(12) United States Patent
Aleksov et al.

(10) Patent No.: US 10,477,688 B2
(45) Date of Patent: Nov. 12, 2019

(54) STRETCHABLE ELECTRONIC ASSEMBLY

(71) Applicant: Intel Corporation, Santa Clara, CA (US)

(72) Inventors: Aleksandar Aleksov, Chandler, AZ (US); Srinivas V. Pietambaram, Gilbert, AZ (US); Rahul N. Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 668 days.

(21) Appl. No.: 14/757,992

(22) Filed: Dec. 24, 2015

(65) Prior Publication Data

US 2017/0188464 A1    Jun. 29, 2017

(51) Int. Cl.
*H05K 1/18* (2006.01)
*H05K 1/02* (2006.01)

(52) U.S. Cl.
CPC ........... *H05K 1/189* (2013.01); *H05K 1/0283* (2013.01); *H01L 2224/73204* (2013.01); *H05K 2201/09263* (2013.01); *H05K 2203/1316* (2013.01); *H05K 2203/308* (2013.01)

(58) Field of Classification Search
CPC ............... H05K 1/189; H05K 1/0283; H05K 2203/308; H05K 2203/1316; H05K 2201/09263; H01L 2224/73204
See application file for complete search history.

(56) References Cited

U.S. PATENT DOCUMENTS

| | | | | |
|---|---|---|---|---|
| 3,749,813 A | * | 7/1973 | Shealy | H01B 5/006 174/127 |
| 6,341,504 B1 | | 1/2002 | Istook | |
| 7,109,253 B1 | * | 9/2006 | Krongauz | C08G 18/69 522/171 |
| 2005/0280138 A1 | | 12/2005 | Shrivastava et al. | |
| 2006/0124351 A1 | | 6/2006 | Kusano et al. | |
| 2006/0223236 A1 | | 10/2006 | Nomura et al. | |

(Continued)

FOREIGN PATENT DOCUMENTS

| JP | 05-007057 A | 1/1993 |
|---|---|---|
| JP | 2002-110717 A | 4/2002 |

(Continued)

OTHER PUBLICATIONS

International Search Report and Written Opinion issued in PCT Application No. PCT/US2015/065257, dated Aug. 30, 2016, 11 pages.

(Continued)

*Primary Examiner* — Anthony J Frost
(74) *Attorney, Agent, or Firm* — Grossman, Tucker, Perreault & Pfleger, PLLC

(57) ABSTRACT

A stretchable electronic assembly comprising a stretchable body, a plurality of electronic components encapsulated in the stretchable body, at least one meandering conductor connected to at least one electronic component of the plurality of electronic components, at least one hollow pocket formed in the stretchable body, the at least one meandering conductor encapsulated in the stretchable body and the at least one meandering conductor located within the at least one hollow pocket formed in the stretchable body.

16 Claims, 12 Drawing Sheets

(56) References Cited

U.S. PATENT DOCUMENTS

| | | |
|---|---|---|
| 2009/0284377 A1* | 11/2009 | Tuttle .............. G06K 19/07749 340/572.7 |
| 2012/0106095 A1 | 5/2012 | Daniel |
| 2012/0176764 A1 | 7/2012 | Loher et al. |
| 2012/0244848 A1 | 9/2012 | Ghaffari et al. |
| 2012/0275124 A1 | 11/2012 | Pludra et al. |
| 2013/0041235 A1 | 2/2013 | Rogers et al. |
| 2014/0240932 A1* | 8/2014 | Hsu ....................... H05K 1/189 361/749 |
| 2014/0374872 A1 | 12/2014 | Rogers et al. |
| 2015/0189753 A1 | 7/2015 | Goyal et al. |

FOREIGN PATENT DOCUMENTS

| | | |
|---|---|---|
| WO | 2010-086416 A1 | 8/2010 |
| WO | 2017-052567 A1 | 3/2017 |
| WO | 2017099795 A1 | 6/2017 |

OTHER PUBLICATIONS

International Search Report and Written Opinion issued in PCT Application No. PCT/US2016/063784, dated Mar. 13, 2017, 13 pages.
International Search Report and Written Opinion issued in PCT Application No. PCT/US2015/052073, dated Jun. 13, 2016, 13 pages.
Unpublished PCT Application No. PCT/US2015/065257, filed Dec. 11, 2015.

* cited by examiner

STRETCHABLE ELECTRONIC ASSEMBLY

FIELD

The present disclosure relates to electronic assemblies, and more particularly to wearable, stretchable electronic assemblies which may be integrated with a skin covering such as a garment or a patch, as well as systems and methods of use thereof.

BACKGROUND

Stretchable electronic assemblies may be used in applications where computing power may be utilized to enhance the application. Healthcare and fitness are examples of just a couple of applications that may utilize stretchable electronic assemblies, which may include one or more sensors to monitor bodily functions (e.g. heart rate).

One class of stretchable electronic assemblies that is rising in importance relates to garments which include electronic components. However, there may be a variety of operational and manufacturing concerns associated with incorporating electronic components into garments that are meant to be worn on the body. One exemplary concern relates to preventing the electrical conductor which connects various components of the stretchable electronic assembly from being damaged when the garment and stretchable electronic assembly are stretched.

FIGURES

The features of this disclosure, and the manner of attaining them, will become more apparent and better understood by reference to the following description of embodiments described herein taken in conjunction with the accompanying drawings, wherein.

DETAILED DESCRIPTION

Figure 1:
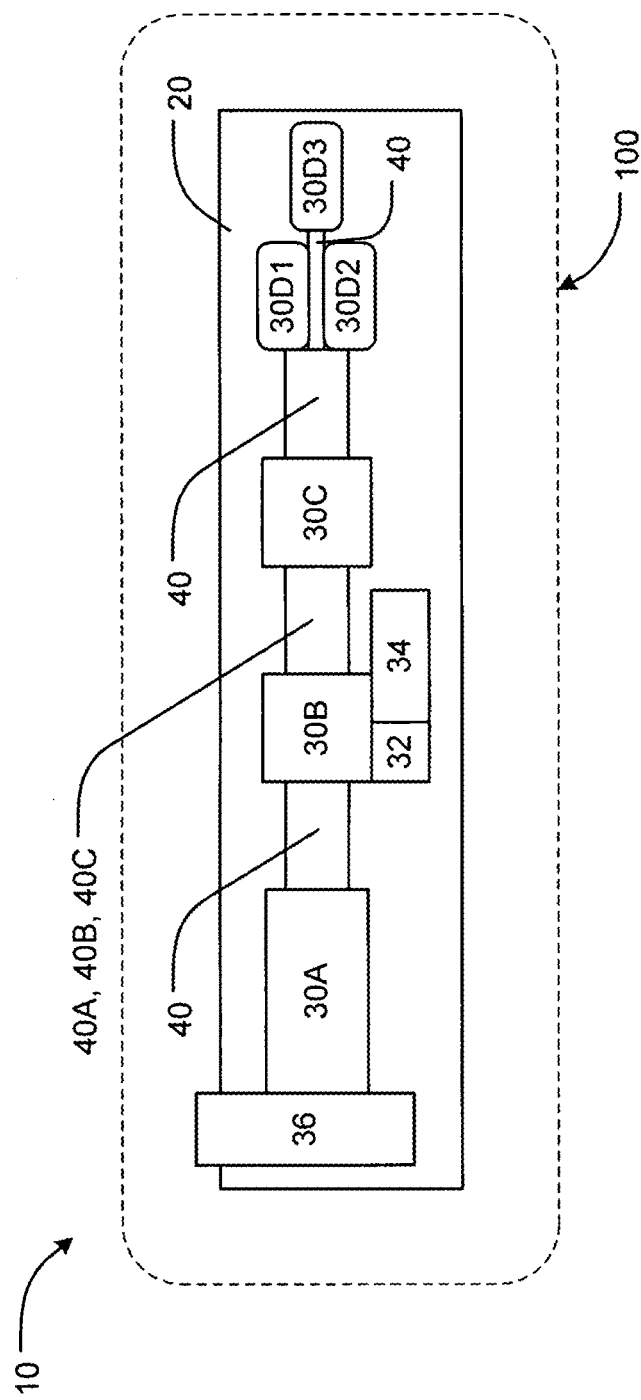
FIG. 1 shows a top (plan) view of an example stretchable electronic assembly according to the present disclosure.

It may be appreciated that the present disclosure is not limited in its application to the details of construction and the arrangement of components set forth in the following description or illustrated in the drawings. The invention(s) herein may be capable of other embodiments and of being practiced or being carried out in various ways. Also, it may be appreciated that the phraseology and terminology used herein is for the purpose of description and should not be regarded as limiting as such may be understood by one of skill in the art.

The following description and the drawings illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The present disclosure relates to electronic assemblies, and more particularly to wearable, stretchable electronic assemblies which may be integrated with a skin covering such as a garment or patch, as well as systems and methods of use thereof. The stretchable wearable electronic systems may be relatively soft and flexible to increase comfort of the user.

The stretchable electronic assemblies of the present disclosure may be produced by high-volume-manufacturing processes, and may be used by a host/body, either by being placed directly on the host/body or integrated with a skin covering, such as a garment or patch, which may be formed of a textile.

In certain embodiments, the manufacturing technology may utilize high volume manufacturing in a manner which includes densely packed electronic assemblies, and a corresponding reduction in size of the stretchable electronic assemblies. The stretchable electronic assemblies described herein may significantly improve IO density between any of the components that are included in the stretchable electronic assemblies. Improving the IO density may increase the functionality and flexibility in the wearable electronic assembles.

As set forth herein, the architecture of the stretchable electronic assembles introduces one or more hollow pockets, which may be understood to be free spaces or cavities, that may reduce stress particularly on electrical conductors of the electronic assembles in response to strain placed on the electronic assembles, and thus increase reliability of the assemblies. The architecture of the stretchable electronic assemblies from the manufacturing processes describe herein may allow for easy hardware programming access, as well as easy integration with garment integrated sensors and other components. Alternatively, the architecture of the stretchable electronic assemblies may be used to generate self-contained systems, such as for medical patches, which may be in the form of a bandage, that are coupled (e.g. bonded) directly on the skin of a host/body.

As used herein, "stretchable" refers to the ability to elongate in the direction of an applied force. The amount of stretching will be determined in part on the application where any of the example stretchable electronic assemblies described herein are to be used. As an example, the degree of stretching may be different when the example stretchable electronic assemblies described herein are integrated with (or detachably connected to) garments (i.e. apparel, clothing) as opposed when the example stretchable electronic assemblies described herein are coupled (e.g. bonded) directly to the skin of a host/body that utilizes any of the example wearable electronic assemblies.

Referring now to FIG. 1, there is shown an example wearable, stretchable electronic assembly 10. Stretchable electronic assembly 10 may be particularly configured to be worn by a host (e.g. a human body) to overlie the skin of the host, either by being part of a garment (i.e. apparel, clothing) or directly coupled (e.g. bonded) to the skin of the host. In such regard, stretchable electronic assembly 10 may be disposed on a skin covering 100 which overlies the skin of the host. Skin covering 100 may comprise, for example, a garment, which may include a hat, bandana, shirt, pants, socks, under-garment, or other clothing articles or apparel. Skin covering 100 may also comprise a wearable patch, particularly to be adhered to the skin of the host.

The stretchable electronic assembly 10 comprises a stretchable body 20, formed of an electrically insulative (e.g. dielectric) material, such as a polymer composition and more particularly an elastomeric polymer composition. The stretchable body 20 may be attached to the skin covering 100 in any manner. The type of skin covering 100 that is used will depend on in part on the application where the stretchable electronic assembly 10 is to be used (among other factors).

The stretchable electronic assembly 10 further includes at least one electronic component 30, and more particularly a plurality of electronic components 30 identified by 30A, 30B, 30C and 30D. Components 30 may be bendable or rigid components (non-stretchable) comprising modules that enable various functions such as, for example, computation, communication, sensor access and driving, power management and power resource. Components 30 may also be passive or active components such as thin bendable dies, thick dies, SiPs, and sensors attached to them by various attachment methods.

In some forms, at least one of the electronic components 30, particularly components 30B and 30C, may comprise a controller or other electronic package. An electronic package may comprise one or more three-dimensional (3D) integrated circuits. More particularly, the electronic package may comprise one or more integrated circuits enclosed in a single module (i.e. 3D package), which may be understood as a system-in-package (SiP). The electronic package may also comprise one or more integrated circuits on a package substrate, which may be understood as a system-on-package (SoP).

At least one of the electronic components 30, and more particularly electronic components 30B or 30C, may be operatively configured to be connectable to an external device (e.g. computer/telecommunications network) having a user interface, either via wire or wirelessly, and this may include a wired or wireless connectivity port 32 for communication therewith. For wireless connectivity, the electronic components 30, and more particularly electronic package 30B or 30C, may include an antenna 34. Wireless connectivity (communication and/or charging) may be enabled either through a chip-antennae or through a stretchable copper-trace based antennae design, which may be provided by an electrical conductor within a hollow pocket as disclosed herein.

Alternatively, or in addition to, at least one of the electronic components 30 may be an electronic sensor 30D, and more particularly a plurality of electronic sensors 30D1, 30D2 and 30D3. At least one of electronic sensors 30D may be an integrated sensor provided as part of a discrete sensor node or pad. Other electronic components 30, particularly electronic components 30B and 30C, may be configured to receive electrical signals from at least one of the electronic sensors 30D. The types of electronic sensors 30D that are included in the stretchable electronic assembly 10 will depend in part on the application where the stretchable electronic assembly 10 is to be used (among other factors).

Alternatively, or in addition to, at least one of the electronic components 30 may be a rechargeable power (storage) source 30A, such as at least one battery, to power the stretchable electronic assembly 10. The power source 30A may be connectable to external power to charge and recharge the power source, either via wired or wireless connection. For example, the power source 30A may be connectable to external power via at least one charging port 36, which may be used to charge the at least one battery.

The electronic components 30 are electrically connected by at least one meandering electrical conductor 40, and more particularly a plurality of meandering electrical conductors 40, which may include 40A, 40B, 40C. At disclosed herein the meandering electrical conductors 40 are encapsulated within stretchable body 20, with the electronic components 30.

Referring to FIGS. 2A-2D, there are shown a cross-sectional view of various stretchable electronic assemblies 10. As shown, the stretchable body 20 includes opposing upper surface 22 and lower surface 24, with exemplary electronic component 30, meandering electrical conductor(s) 40 and electrically conductive pad(s) 50 encapsulated in stretchable body 20, which may comprises an upper section 20A and a lower section 20B.

Each electrically conductive pad 50 is electrically coupled to at least one of the electronic components 30 and/or at least one of the meandering electrical conductors 40. As shown by FIG. 2B, at least one of the electrically conductive pads 50 may be exposed from the stretchable body 20, and more particularly a plurality of the electrically conductive pads 50 may be exposed from the stretchable body 20, which may include all of the electrically conductive pads.

Electronic component 30 may be attached to an electrically conductive pad 50 by an attachment layer 60 (and possibly underfill if required). As shown the attachment layer 60 may overhang the electronic component 30. Electrically conductive pad 50 may comprise a gold electrical contact 52 and a dielectric island 54 where electronic component 30 is placed.

It should be noted that any of the electronic components 30 that are included in the electronic assembly 10 may be attached by various attachment methods (e.g., soldering). A variety of other attachment methods are contemplated including the use of ACF, ACP, self-assembled solder joint pastes and other attachment methods known in the art.

As shown in FIG. 2B, at least one of the electrically conductive pads 50 may be exposed from the lower surface 24 of the stretchable body 20 at opening (via) 44. Alternatively, in other variants, at least one of the electrically conductive pads 50 may be exposed from the upper surface 22 of the stretchable body 20, or an electrically conductive pad 50 may be exposed from both the upper surface 22 and the lower surface 24 of the stretchable body 20. In still other variants, the meandering electrical conductors 40 may be partially exposed from the upper surface 22 and/or the lower surface 24 of the stretchable body 20 in similar manner to the electrically conductive pads 50.

Figure 2A:
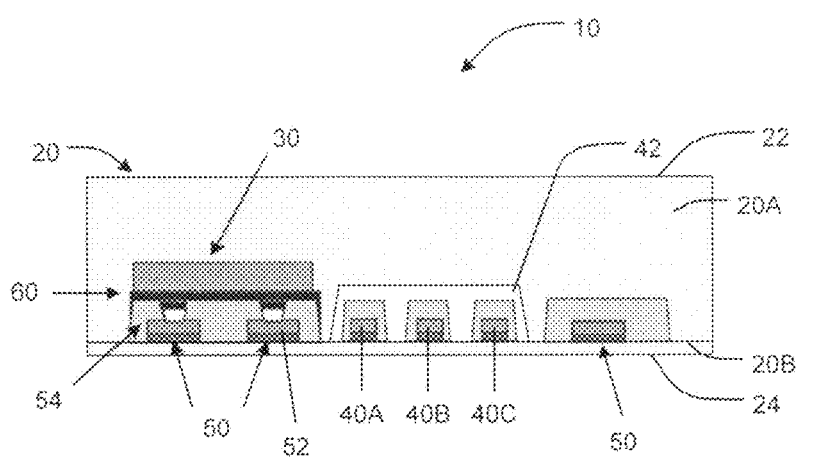
FIG. 2A shows a side view of another example stretchable electronic assembly according to the present disclosure.
Figure 2B:
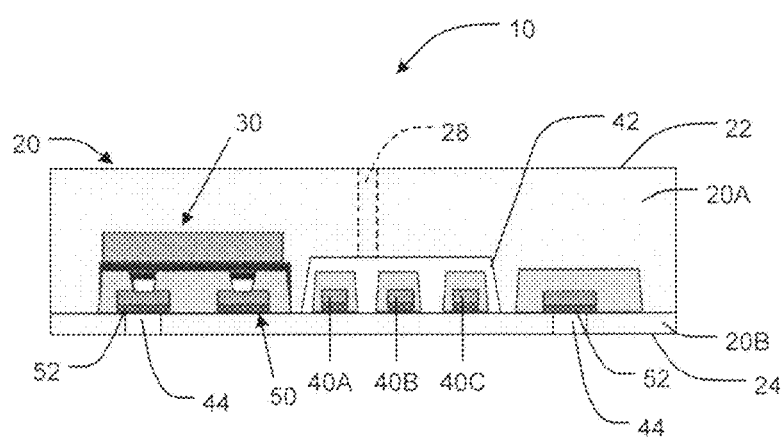
FIG. 2B shows a side view of another example stretchable electronic assembly according to the present disclosure.

Also as shown in FIGS. 2A-2B, the meandering electrical conductors 40A, 40B and 40C, are encapsulated in the stretchable body 20, and are more particularly located within a hollow pocket 42 formed in the stretchable body 20. Hollow pocket 42 may be formed using a sacrificial core 70 (see, for example, FIGS. 4A-4B) formed of a sacrificial material, such as thermally decomposable polymer as described herein.

In FIGS. 2A and 2B, the meandering electrical conductors 40A/40B/40C are each located within a same (shared) hollow pocket 42 formed in the stretchable body 20. In contrast to FIG. 2A, in FIG. 2B the electrical contacts 52 are shown exposed, with openings/vias 44 created by laser drilling (standard panel-level via creation) for programming and connectivity access. Openings/vias 44 may also be formed using a sacrificial core 80 (see, for example, FIGS. 5A-5B) formed of a sacrificial material. In contrast to FIG. 2A, in FIG. 2C, the meandering electrical conductors 40A, 40B and 40C are each located in different (separate) hollow pockets 42A, 42B and 42C formed in the stretchable body 20, respectively.

Figure 3A:
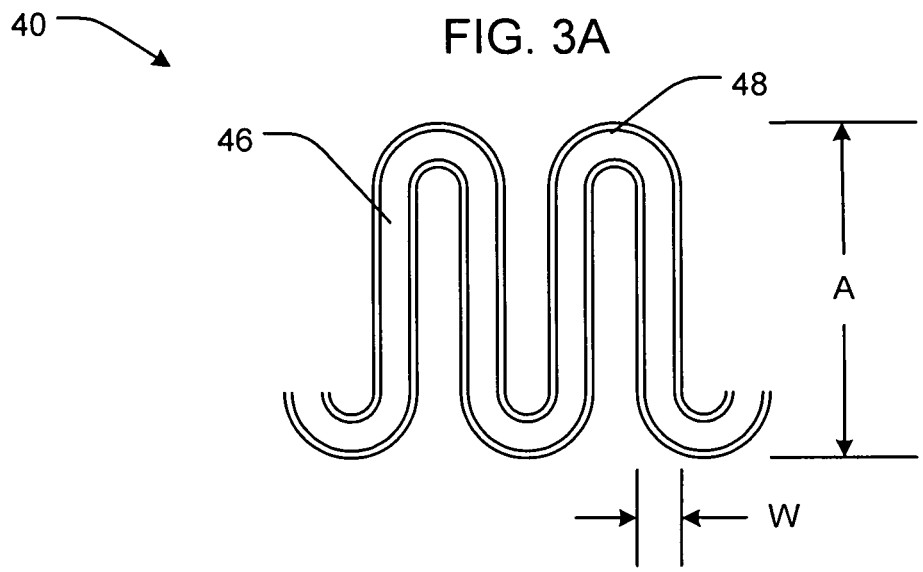
FIG. 3A shows a top (plan) view of an example meandering electrical conductor which may be used in any of the stretchable electronic assemblies according to the present disclosure.

Referring to FIG. 3A, the meandering electrical conductors 40, such as 40A/40B/40C, may have a substantially sinusoidal shape. The sinusoidal shape may have a conductor amplitude (A) to conductor width (W) ratio of at least 5 to 1 and more particularly of at least 10 to 1. In some forms, the conductor width W may be in a range of 20-50 micrometers depending on various manufacturing considerations.

As shown, meandering electrical conductor 40 may comprise a meandering trace 46, which may be copper based and, and which may be covered by a meandering electrical (e.g. dielectric) insulator 48, which may be a film. Electrical insulator 48 may be provided by a polymeric composition, which may comprise one or more thermoplastic polymers, such as polyimide.

Encapsulation around the meandering trace 46 by insulator 48 may be performed in a number of different ways including excimer laser ablation of the dielectric, photo-imageable process using photo-imageable dielectric or resist-based mask and subsequent selective dielectric removal. Electrical insulator 48 may not be required where stretchable body 20 provides suitable electric insulation.

Figure 2C:
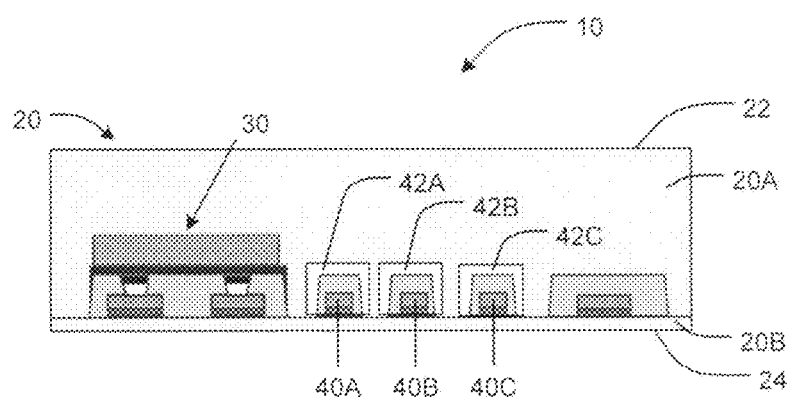
FIG. 2C shows a side view of another example stretchable electronic assembly according to the present disclosure.
Figure 3E:
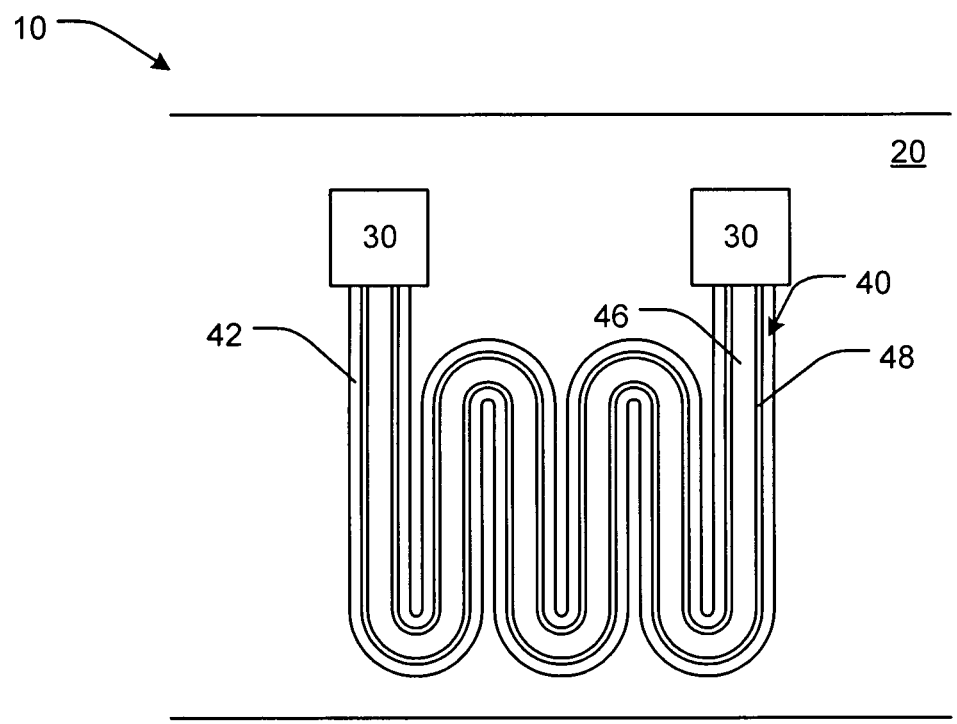
FIG. 3E shows a top (plan) view of an example meandering electrical conductor within a meandering hollow pocket of a stretchable electronic assembly according to the present disclosure.
Figure 3B:
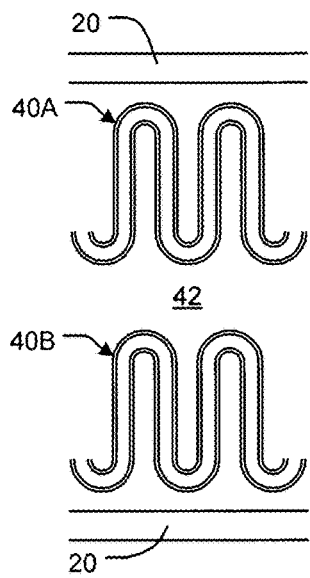
FIG. 3B shows a top (plan) view of two example meandering electrical conductors each within a shared non-meandering hollow pocket according to the present disclosure.
Figure 3C:
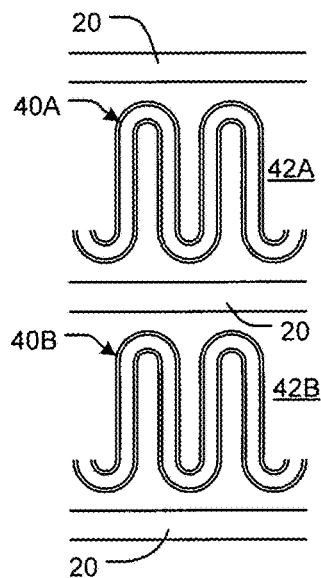
FIG. 3C shows a top (plan) view of two example meandering electrical conductors each within separate non-meandering hollow pockets according to the present disclosure.
Figure 3D:
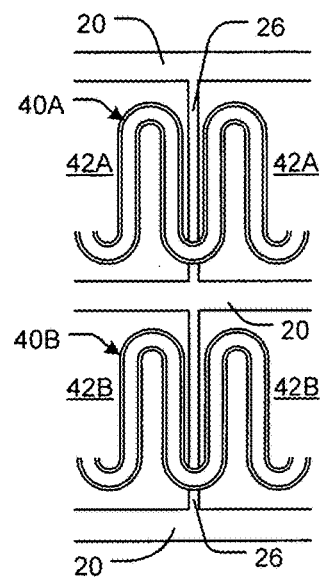
FIG. 3D shows a top (plan) view of two example meandering electrical conductors each within separate non-meandering hollow pockets with each hollow pocket having at least one supporting cross structure (e.g. rib) according to the present disclosure.

As shown in FIGS. 3B-3D, meandering electrical conductors 40A/40B are located in a non-meandering hollow pocket 42. In FIG. 3B, a plurality of meandering electrical conductors 40, shown as conductors 40A/40B, are each located within a same (shared) hollow pocket 42, which is similar to FIGS. 2A and 2B. In FIG. 3C, a plurality of meandering electrical conductors 40, shown as conductors 40A/40B, are each located within different (separate) hollow pockets 42A/42B, which is similar to FIG. 2C.

As shown in FIG. 3D, the hollow pockets 42A/42B containing meandering electrical conductors 40A/40B, respectively, may contain a transverse (cross) supporting structure 26, such as a cross rib, to provide mechanical crossing supports which inhibit the collapse of the hollow pockets 42A/42B.

Figure 2D:
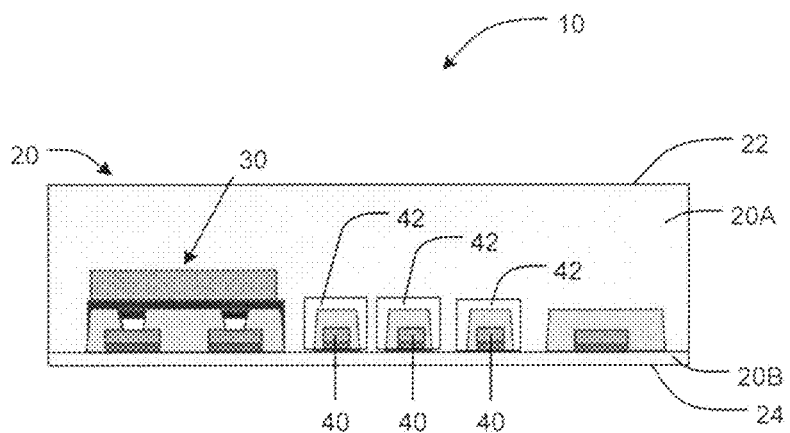
FIG. 2D shows a side view of another example stretchable electronic assembly according to the present disclosure.

As shown in FIG. 3E, a meandering electrical conductor 40 may be located in a meandering hollow pocket 42 formed in the stretchable body 20, which may provide a substantially sinusoidal shape corresponding to the substantially sinusoidal shape of meandering electrical conductor 40. A cross-sectional view of a substantially sinusoidal meandering electrical conductor 40 located in a substantially sinusoidal pocket 42 is shown at FIG. 2D.

As shown by FIGS. 2A-2D, as well as FIGS. 3B-3E, the hollow pockets 42, such as 42A/42B/42C, are larger, particularly in width and height, than the meandering conductors 40, such as 40A/40B/40C, such that the meandering conductor 40 located within the hollow pocket 42 is spaced from the stretchable body 20 by the hollow pocket 42. Further, while meandering conductor 40 is shown in contact with lower section 20B of stretchable body 20, it may be appreciated that meandering conductor 40 merely rests on lower section 20B of stretchable body 20 and is not mechanically or adhesively coupled thereto.

In the foregoing manner, the length of the meandering conductor 40 located within the hollow pocket 42, while being secured to components 30 as shown in FIG. 3E, is unsecured in the hollow pocket 42, and more particularly unsecured from the stretchable body 20 and "free float" therein.

It may be understood that by decoupling the meandering electrical conductors 40 from the surrounding encapsulating stretchable body 20, and making the hollow pockets 42 larger than the meandering electrical conductors 40, elongation strain which may be induced in the stretchable body 20 during stretching thereof may not be transmitted to the meandering electrical conductors 40 as to stress the meandering electrical conductors 40. As such, the meandering electrical conductors 40 of the present disclosure may be used to connect the various rigid components 30, as well as be used to form a stretchable antenna 54, particularly by surrounding them with a hollow pocket 42 which may provide improved reliability of the meandering electrical conductors 40 during cyclic elongation/stretching of the stretchable body 20. In particular, neither the trace 46 nor the insulator 48 need to be formed of a material with similar stretch characteristics to the stretchable body 20, and virtually any materials may be used which do not have to be stretchable.

While preferably the overall length of the meandering electrical conductor 40 (between the electronic components 30) located within the hollow pocket 42 may be unsecured in the hollow pocket 42 from the surrounding structure (and more particularly unsecured from the stretchable body 20), the overall length of the meandering electrical conductor 40 within the hollow pocket 42 may not necessarily be unsecured in the hollow pocket 42 (and more particularly unsecured from the stretchable body 20), and only a portion of the overall length of the meandering electrical conductor 40 may be unsecured. For example, in certain embodiments, at least 50% of the length of the meandering electrical conductor 40 located within the hollow pocket 42 may be unsecured in the hollow pocket 42, and more particularly unsecured from the stretchable body 20. In other embodiments, at least 60%, 70%, 80%, 90% or 95% of the length of the meandering electrical conductor 40 located within the hollow pocket 42 may be unsecured in the hollow pocket 42, and more particularly unsecured from the stretchable body 20.

Referring to FIGS. 4A-6B, forming a hollow pocket 42 in the stretchable body 20 with a meandering conductor 40 located within the hollow pocket 42 formed in the stretchable body 20 may be accomplished by first encapsulating meandering conductor 40 in a sacrificial core/material 70, which may be formed of a thermally decomposable polymer. The sacrificial core 70 may be stencil printed at room temperature for low cost applications, or may be patterned using a standard photo-definable process where tighter tolerances are required.

An example sacrificial material to form sacrificial core 70 may be a polynorbornene and/or polycarbonate based polymer which may thermally decompose when heated. Exemplary sacrificial materials may be obtained from Promerus LLC.

The plurality of electronic components 30 and the sacrificial core 70 including the meandering conductor 40 may then be encapsulated in a polymer material to form the stretchable body 20. The stretchable body 20 may be molded from a thermoplastic or thermoset polymer composition, such as a liquid silicone elastomer, which may achieve cure with a hardening reaction.

Thereafter, removing the sacrificial core 70 to form the hollow pocket 42 in the stretchable body 20 with the meandering conductor 40 located within the hollow pocket 42 formed in the stretchable body 20 may be performed by heating the polymer used to form the sacrificial core 70 to a suitable temperature to decompose the sacrificial material into gaseous by-products. For example for the sacrificial core materials contemplated, the sacrificial core 70 may be heated to a range of 200° C. to 250° C.

During decomposition of the sacrificial core 70, the gaseous by-products may diffuse through the polymer material use to form the stretchable core 20. As such, the stretchable body 20 may be understood to be porous to the gaseous by-products. In order to expedite escape of the gaseous by-products, one or more through-holes 28 (see FIG. 2A) may be formed in the stretchable body 20 to vent the gaseous by-products to the surrounding atmosphere.

Referring now to FIGS. 4A-4B, 5A-5B and 6A-6B, there are shown process flow diagrams of different high volume manufacturing panel processes to provide the wearable electronic assemblies 10 of FIGS. 2A, 2B and 2C, respectively. It should be understood that while the illustrations show a single (top) sided panel process, the present disclosure is extendable to a dual sided panel-level process where both sides of the carrier panel are used to create/buildup the stretchable electronic assembly 10.

Figure 4A:
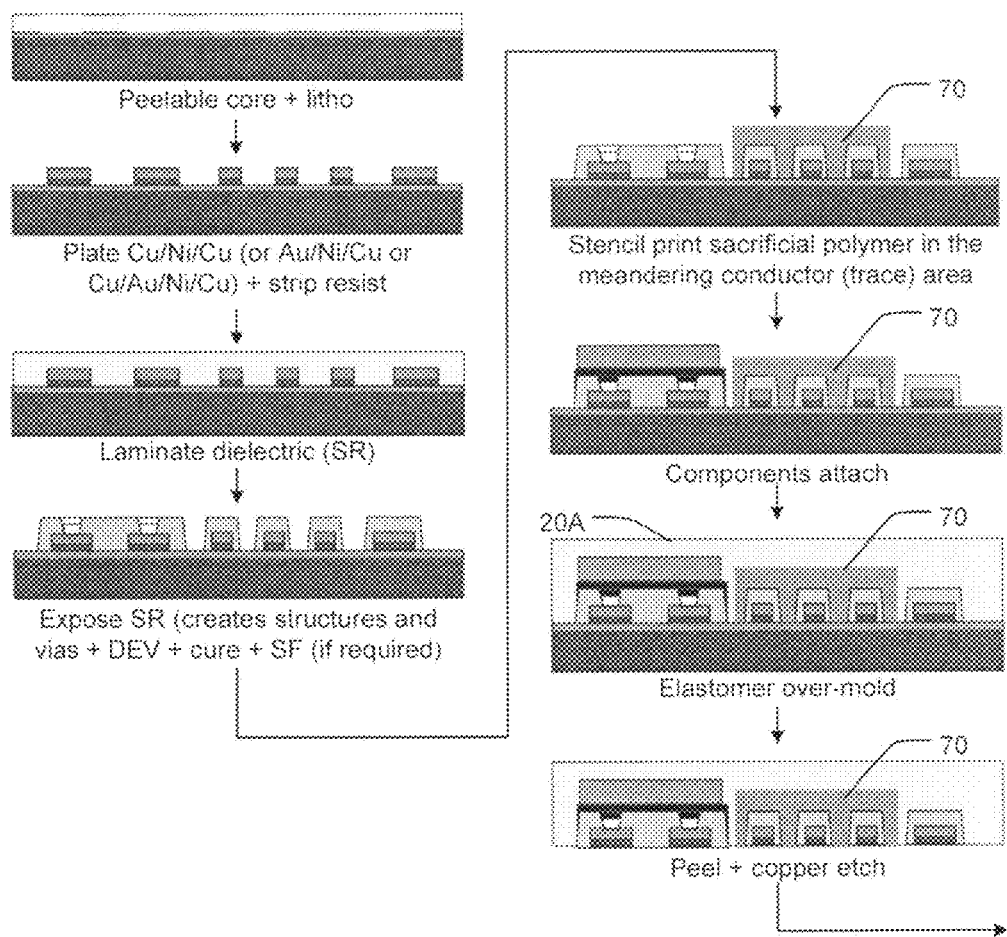
FIGS. 4A-4B show side views of another example stretchable electronic assembly at various stages of manufacture according to the present disclosure.
Figure 4B:
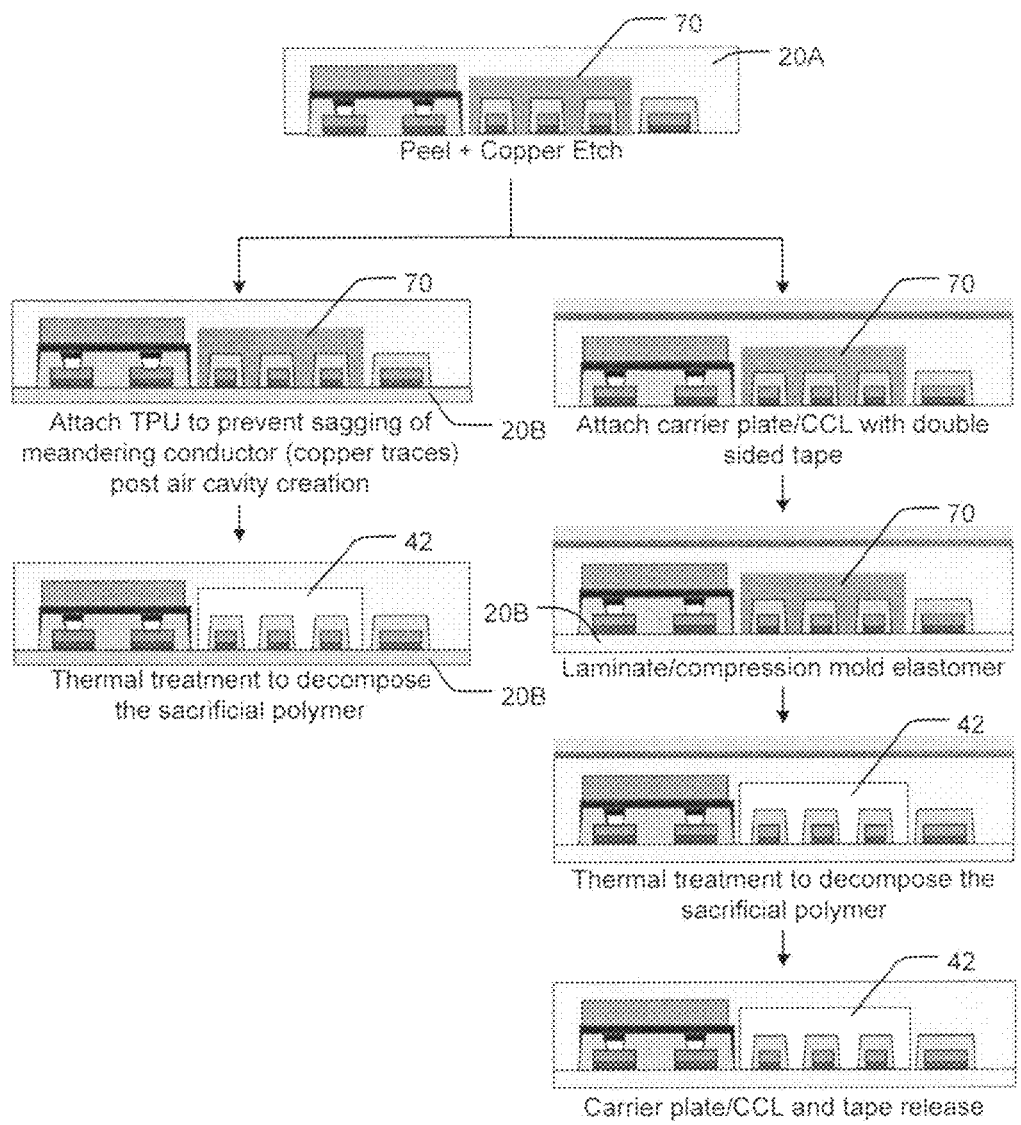

The process flow diagrams of FIGS. 4A-4B and FIGS. 5A-5B make use of the meandering conductor 40 of FIG. 3A, which may be electrically insulated with insulator 48. Referring to FIGS. 4A-4B, as set forth above, there is shown a process flow to form the stretchable electronic assembly 10 of FIG. 2A, particularly with hollow pocket 42 surrounding meandering electrical conductors 40A/40B/40C, in a manner as shown in FIG. 3B (electrical conductor 40C not shown). As set forth herein, sacrificial core 70 may formed in place around the meandering electrical conductors 40A/40B/40C, particularly by being stencil printed from a sacrificial material (e.g. polynorbornene) such that the meandering electrical conductors 40 are encapsulated/embedded therein. Once the sacrificial core 70 is formed in place in the desired region, upper section 20A of stretchable body 20 is overmolded over the sacrificial core 70, as well as the components 30. Thereafter, a lower section 20B of stretchable body 20 may be formed in place (e.g. compression molded) or otherwise attached (e.g. laminated) and bonded to the upper section 20A, without bonding to the meandering electrical conductor 40 such that the meandering electrical conductor 40 remains unsecured in hollow pocket 42.

Lower section 20B may be used to prevent sagging of the meandering electrical conductors 40 after removal of the sacrificial core 70, as well as locate the meandering electrical conductors 40A/40B/40C in a fully enclosed hollow pocket 42. Lower section 20B may be formed of thermoplastic urethane (TPU) elastomer or polydimethylsiloxane (PDMS) elastomer, which may be provided in the form of a film for lamination, or a flowable material for compression molding.

Figure 5A:
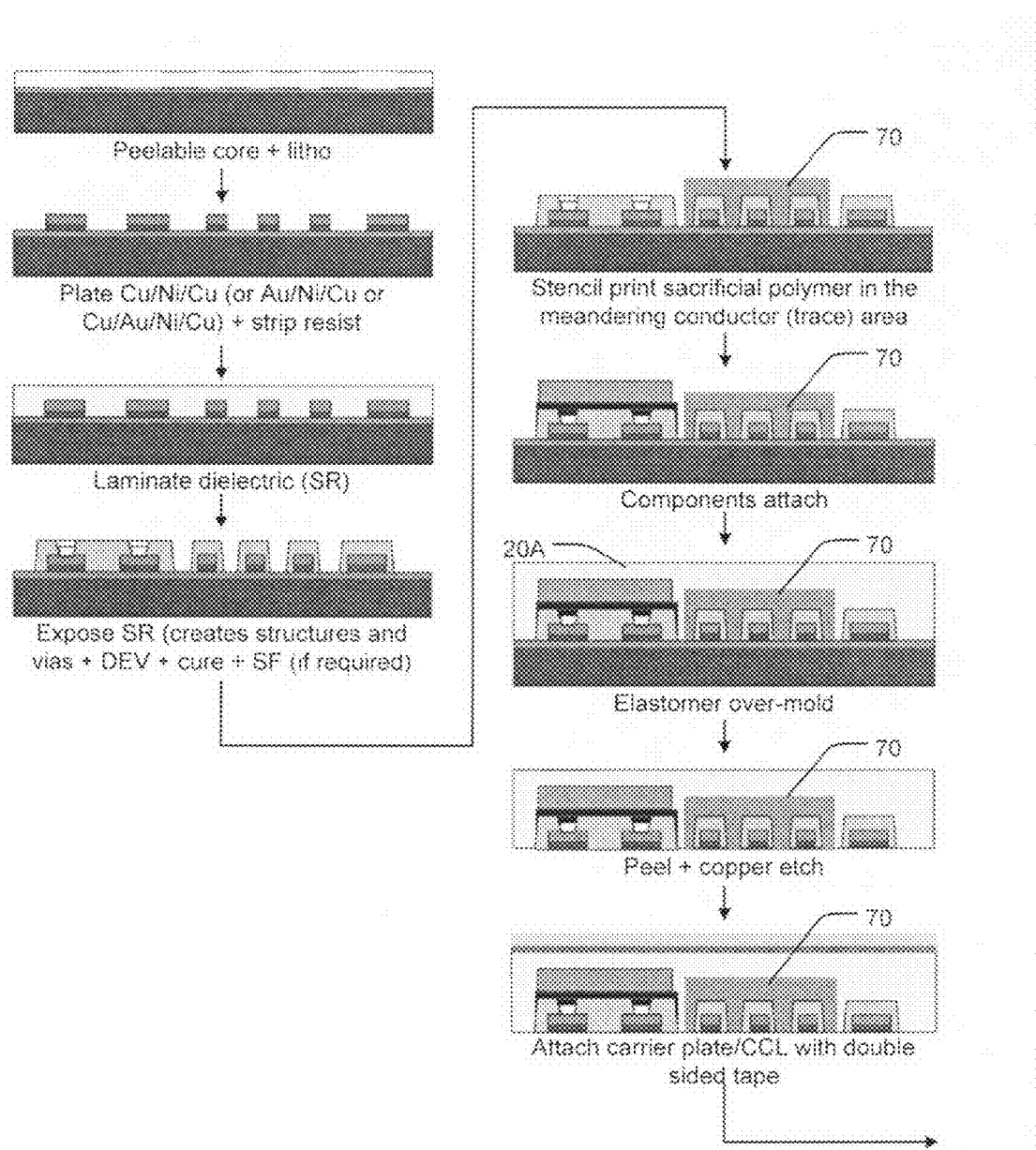
FIGS. 5A-5B show side views of another example stretchable electronic assembly at various stages of manufacture according to the present disclosure.
Figure 5B:
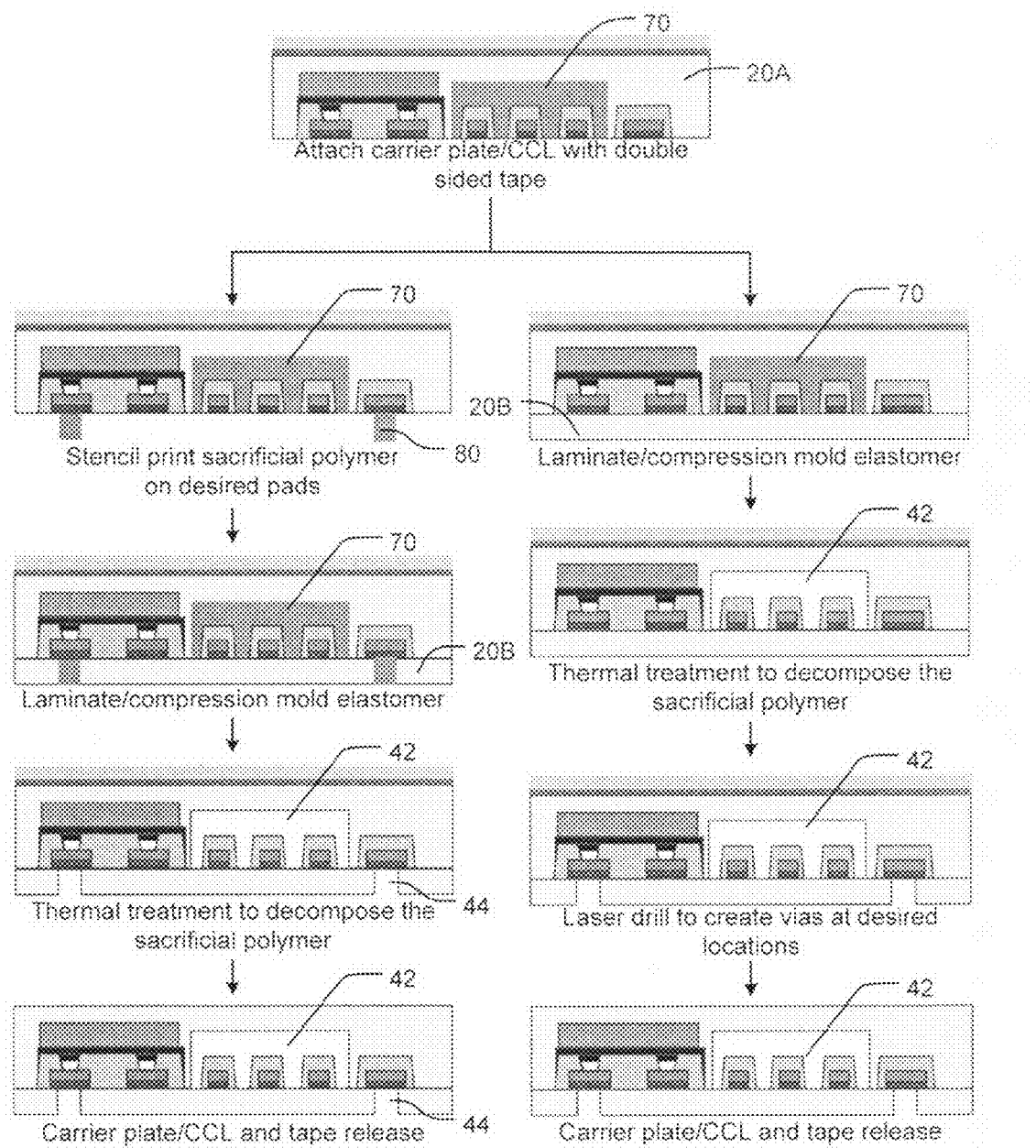

Referring to FIGS. 5A-5B, there is shown an extension of the process in at least one variant where the openings/vias 44 to access pads 50 may also be formed using a sacrificial core 80 to form the stretchable electronic assembly 10 of FIG. 2B. In the process of FIGS. 5A-5B, sacrificial core 80 may formed at the location to be used for openings/vias 44. Similar to sacrificial core 70, sacrificial core 80 may be stencil printed from a sacrificial material such as polynorbornene. Once the sacrificial core 80 is formed in place in the desired region, lower section 20B of stretchable body 20 may be overmolded over the sacrificial core 80. Thereafter, sacrificial core 70 and sacrificial core 80 may be removed, particularly be being thermally decomposed.

Figure 6A:
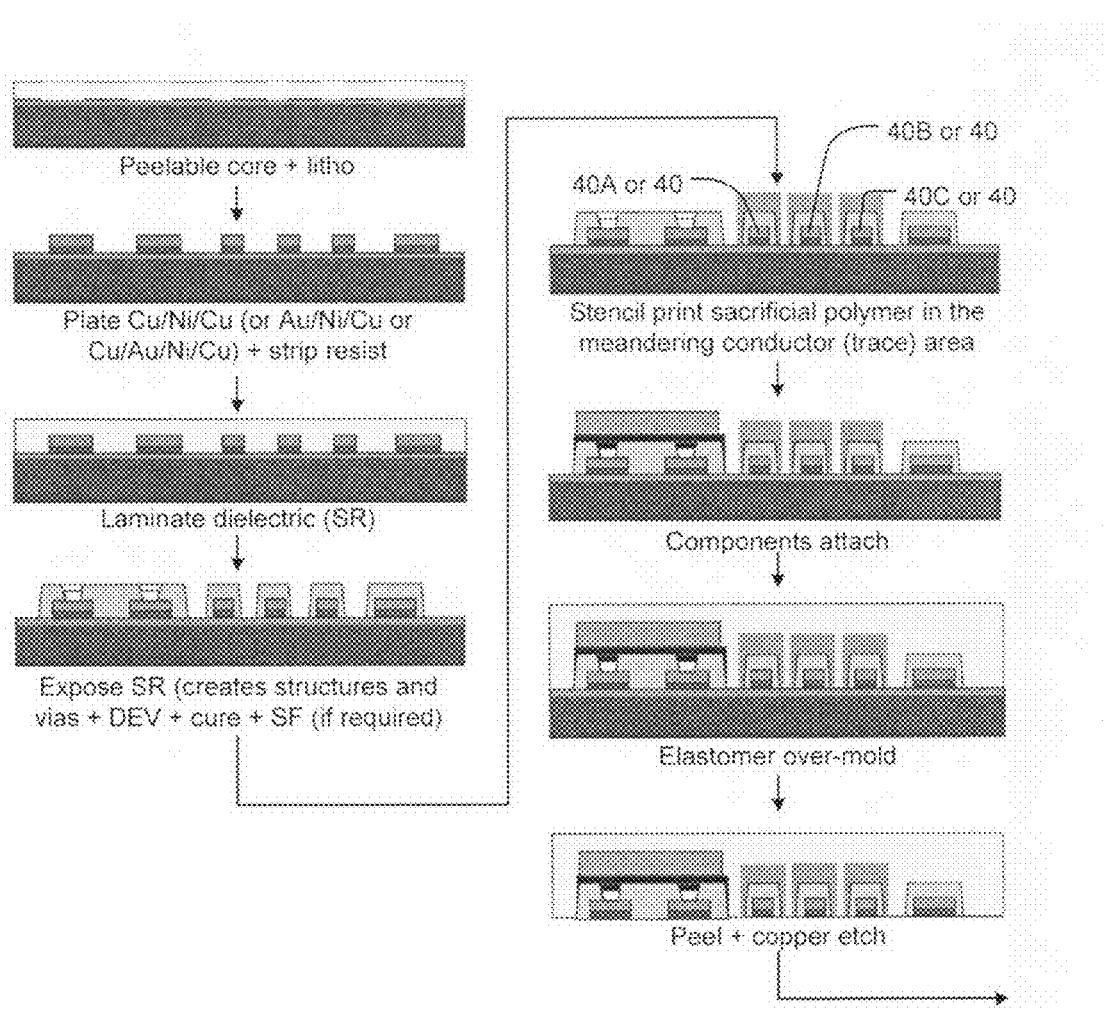
FIGS. 6A-6B show side views of another example stretchable electronic assembly at various stages of manufacture according to the present disclosure.
Figure 6B:
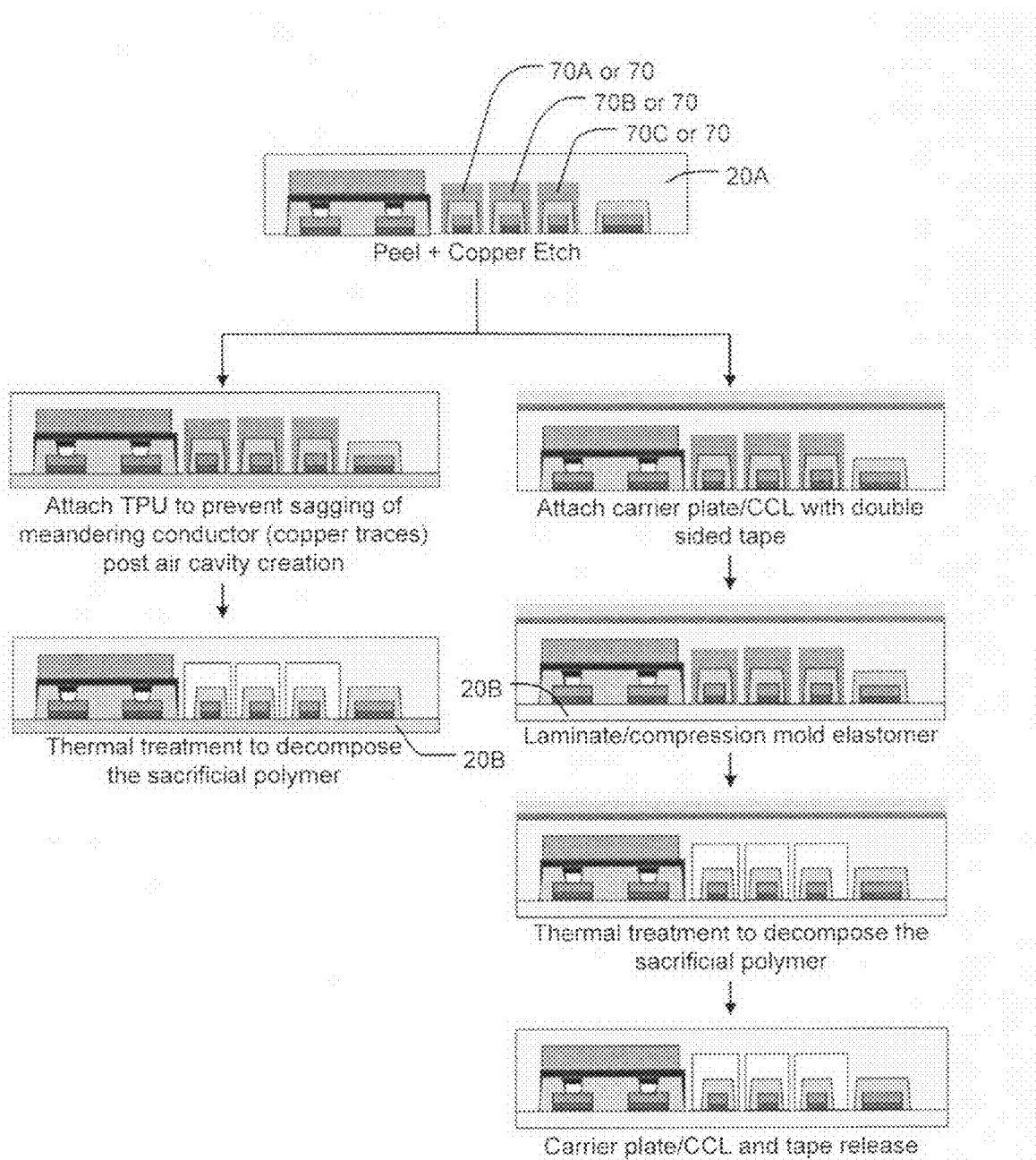

Referring to FIGS. 6A-6B, there is shown an extension of the process in at least one variant to form the stretchable electronic assembly 10 of FIG. 2C, particularly with hollow pockets 42A/42B/42C surrounding meandering electrical conductors 40A/40B/40C, in a manner as shown in FIG. 3C or FIG. 3D (electrical conductor 40C not shown). As shown, sacrificial cores 70A/70B/70C may formed in place around the meandering electrical conductors 40A/40B/40C, particularly by being stencil printed from a sacrificial material (e.g. polynorbornene) such that the meandering electrical conductors 40A/40B/40C are encapsulated/embedded therein. The process may then be repeated as set forth above.

Alternatively, the process may be used to form the stretchable electronic assembly 10 of FIG. 2D, particularly with a meandering hollow pocket 42 surrounding meandering electrical conductor 40, in a manner as shown in FIG. 3E. As shown, meandering sacrificial core 70 may formed in place around the meandering electrical conductor 40, particularly by being stencil printed from a sacrificial material (e.g. polynorbornene) such that the meandering electrical conductor 40 is encapsulated/embedded therein. The process may then be repeated as set forth above.

As shown in FIGS. 4A-6B, the processes as disclosed use a carrier panel that is dubbed "peelable core". This carrier panel may have different configurations. For the process flows described in FIGS. 4A-6B the panel has two copper layers that are separated by a weak layer that allows for separation of the manufactured stretchable assembly or SiP from the carrier. In the foregoing manner, at the end of the process a copper etch process is part of the flow to remove this sacrificial copper layer. However there can be other configurations of two dielectric layers, a dielectric and copper layer to allow for peeling. In case that the sacrificial material after peel is a dielectric, a removal process such as for instance wet-blast will be used to remove this dielectric, instead of a copper etch.

In case gold cannot be plated as the first plating step and if gold is required on the bottom side for better contact or oxidation protection of contact pads, a process may be added after peel by an electroless gold plating process. The Pd/gold surface finish step illustrated prior to the component attach may not be needed for component attach (in fact for any solder or solder-paste based process this may well be the case). The last step in all processes that is not mentioned is singulation where individual units are cut out from the panel.

Figure 7:
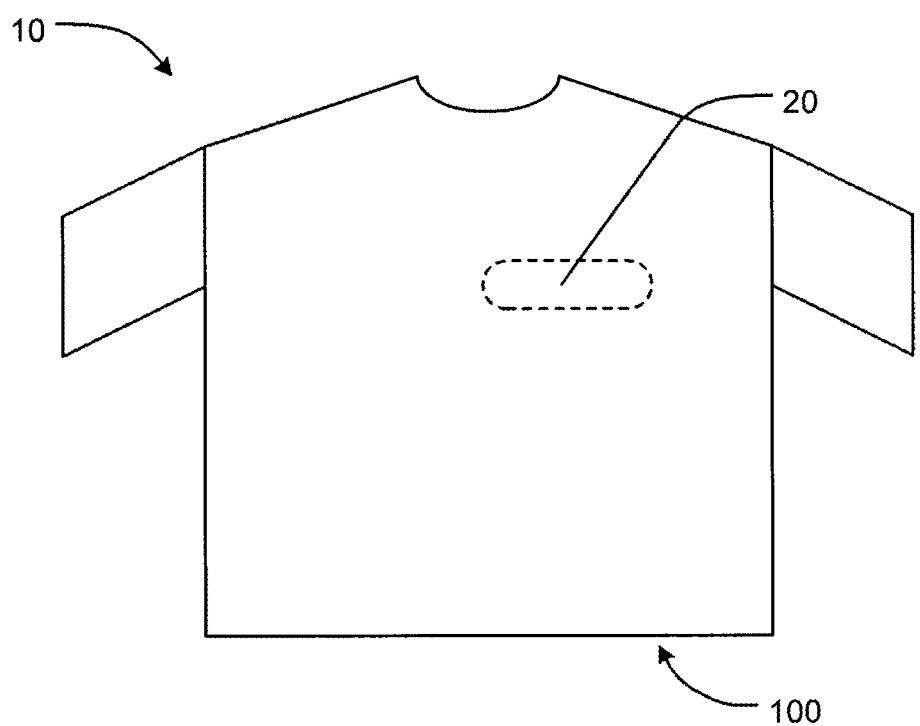
FIG. 7 shows an example stretchable electronic assembly including a garment according to the present disclosure.

Referring to FIG. 7, there is shown stretchable electronic assembly 10 comprising stretchable 20 attached to a skin covering 100 in the form of a garment, and more particularly a shirt.

The following examples pertain to further embodiments, from which numerous permutations and configurations will be apparent.

Example 1 discloses a stretchable electronic assembly, comprising a stretchable body; a plurality of electronic components encapsulated in the stretchable body; at least one meandering conductor connected to at least one electronic component of the plurality of electronic components; at least one hollow pocket formed in the stretchable body; the at least one meandering conductor encapsulated in the stretchable body; and the at least one meandering conductor located within the at least one hollow pocket formed in the stretchable body.

Example 2 discloses the subject matter of Example 1, wherein the at least one meandering conductor located within the at least one hollow pocket has a length; and at least a portion of the length of the at least one meandering conductor located within the at least one hollow pocket is unsecured in the at least one hollow pocket.

Example 3 discloses the subject matter of Example 1, wherein the at least one meandering conductor located within the at least one hollow pocket has a length; and at least a portion of the length of the at least one meandering conductor located within the at least one hollow pocket is unsecured from the stretchable body.

Example 4 discloses the subject matter of Example 1, wherein the at least one hollow pocket is larger than the at least one meandering conductor such that at least a portion of the at least one meandering conductor located within the at least one hollow pocket is spaced from the stretchable body by the hollow pocket.

Example 5 discloses the subject matter of Example 1, wherein the at least one hollow pocket formed in the stretchable body further comprises at least one meandering hollow pocket formed in the stretchable body, and the at least one meandering conductor is located within the at least one meandering hollow pocket formed in the stretchable body.

Example 6 discloses the subject matter of Example 5, wherein the at least one meandering conductor and the at least one meandering hollow pocket have a corresponding shape.

Example 7 discloses the subject matter of Example 1, wherein the at least one meandering conductor connected to at least one electronic component of the plurality of electronic components comprises a plurality of meandering conductors each connected to at least one electronic component of the plurality of electronic components; each of the plurality of meandering conductors are encapsulated in the stretchable body; and each of the plurality of meandering conductors are located within a same hollow pocket of the at least one hollow pocket formed in the stretchable body.

Example 8 discloses the subject matter of Example 1, wherein the at least one meandering conductor connected to at least one electronic component of the plurality of electronic components comprises a plurality of meandering conductors each connected to at least one electronic component of the plurality of electronic components; the at least one hollow pocket formed in the stretchable body comprises a plurality of hollow pockets formed in the stretchable body; each of the plurality of meandering conductors are encapsulated in the stretchable body; and each of the plurality of meandering conductors are located within a different hollow pocket formed in the stretchable body.

Example 9 discloses the subject matter of Example 1, wherein the at least one meandering conductor connected to at least one electronic component of the plurality of electronic components comprises an electrical trace.

Example 10 discloses the subject matter of Example 9, wherein the at least one meandering conductor connected to at least one electronic component of the plurality of electronic components further comprises an electrical insulator which overlies the electrical trace.

Example 11 discloses the subject matter of Example 10, wherein the electrical insulator is a dielectric insulator.

Example 12 discloses the subject matter of Example 1, wherein the stretchable body is formed of a thermoplastic or thermoset polymer.

Example 13 discloses the subject matter of Example 1, wherein the stretchable body is formed of an elastomer.

Example 14 discloses the subject matter of Example 1, wherein the stretchable body comprises at least one molded body.

Example 15 discloses the subject matter of Example 1, wherein the stretchable body comprises a film.

Example 16 discloses the subject matter of Example 1, wherein the at least one meandering conductor provides an antenna.

Example 17 discloses a method of forming a stretchable electronic assembly, comprising providing a plurality of electronic components; providing at least one meandering conductor connected to at least one electronic component of the plurality of electronic components; forming a stretchable body; and forming at least one hollow pocket in the stretchable body with the at least one meandering conductor located within the at least one hollow pocket formed in the stretchable body.

Example 18 discloses the subject matter of Example 17, wherein forming the stretchable body and forming at least one hollow pocket in the stretchable body with the at least one meandering conductor located within the at least one hollow pocket formed in the stretchable body further comprise encapsulating at least a portion of the at least one meandering conductor in a sacrificial material; encapsulating the plurality of electronic components and at least a portion of the sacrificial material including the at least one meandering conductor in a polymer material to form the stretchable body; and removing the sacrificial material to form at least one hollow pocket in the stretchable body with the at least one meandering conductor located within the at least one hollow pocket formed in the stretchable body.

Example 19 discloses the subject matter of Example 18, wherein removing the sacrificial material to form at least one hollow pocket in the stretchable body is performed by heating the sacrificial material.

Example 20 discloses the subject matter of Example 18, wherein removing the sacrificial material to form at least one hollow pocket in the stretchable body is performed by decomposing the sacrificial material.

Example 21 discloses the subject matter of Example 18, wherein the sacrificial material is a polymer material.

Example 22 discloses the subject matter of Example 17, further comprising forming at least one via in the stretchable body by providing a sacrificial material at a location to form the at least one via; forming the stretchable body around the sacrificial material to form the at least one via; and removing the sacrificial material to form the at least one via in the stretchable body.

Example 23 discloses the subject matter of Example 22, wherein removing the sacrificial material to form the at least one via in the stretchable body is performed by heating the sacrificial material.

Example 24 discloses the subject matter of Example 22, wherein removing the sacrificial material to form the at least one via in the stretchable body is performed by decomposing the sacrificial material.

While a preferred embodiment of the present invention(s) has been described, it should be understood that various changes, adaptations and modifications can be made therein without departing from the spirit of the invention(s) and the scope of the appended claims. The scope of the invention(s) should, therefore, be determined not with reference to the above description, but instead should be determined with reference to the appended claims along with their full scope of equivalents. Furthermore, it should be understood that the appended claims do not necessarily comprise the broadest scope of the invention(s) which the applicant is entitled to claim, or the only manner(s) in which the invention(s) may be claimed, or that all recited features are necessary.

What is claimed is:

1. A stretchable electronic assembly, comprising:
    a stretchable body;
    a plurality of electronic components encapsulated in the stretchable body;
    at least one non-meandering hollow pocket formed in the stretchable body; and
    one or more meandering conductors connected to one or more electronic components of the plurality of electronic components via one or more end portions of the one or more meandering conductors, wherein at least each of the one or more meandering conductors aside from the one or more end portions is encapsulated within the at least one non-meandering hollow pocket.

2. The stretchable electronic assembly of claim 1, wherein:
    at least one of the one or more meandering conductors located within the at least one non-meandering hollow pocket has a length; and
    at least a portion of the length of the at least one meandering conductor located within the at least one non-meandering hollow pocket is unsecured in the at least one non-meandering hollow pocket.

3. The stretchable electronic assembly of claim 1, wherein:
    at least one of the one or more meandering conductors located within the at least one non-meandering hollow pocket has a length; and
    at least a portion of the length of the at least one meandering conductor located within the at least one non-meandering hollow pocket is unsecured from the stretchable body.

4. The stretchable electronic assembly of claim 1, wherein:
    the at least one non-meandering hollow pocket is larger than the one or more meandering conductors, such that at least a portion of the one or more meandering conductors located within the at least one non-meandering hollow pocket is spaced from the stretchable body by the hollow pocket.

5. The stretchable electronic assembly of claim 1, wherein a meandering additional hollow pocket is formed in the stretchable body, wherein the stretchable electronic assembly comprises multiple meandering conductors connected to the one or more electronic components of the plurality of electronic components, and wherein one of the multiple meandering conductors is located within the meandering additional hollow pocket.

6. The stretchable electronic assembly of claim 1, wherein:
    at least one of the one or more meandering conductors encapsulated within the at least one non-meandering hollow pocket comprises a substantially sinusoidal path.

7. The stretchable electronic assembly of claim 1, wherein:
    the one or more meandering conductors comprises a plurality of meandering conductors each connected to at least one electronic component of the plurality of electronic components;
    each of the plurality of meandering conductors are encapsulated in the stretchable body; and
    each of the plurality of meandering conductors are located within a same non-meandering hollow pocket of the at least one non-meandering hollow pocket formed in the stretchable body.

8. The stretchable electronic assembly of claim 1, wherein:
    the one or more meandering conductors comprises a plurality of meandering conductors each connected to at least one electronic component of the plurality of electronic components;
    the at least one non-meandering hollow pocket formed in the stretchable body comprises a plurality of non-meandering hollow pockets formed in the stretchable body;
    each of the plurality of meandering conductors are encapsulated in the stretchable body; and
    each of the plurality of meandering conductors are located within a different non-meandering hollow pocket of the plurality of non-meandering hollow pockets formed in the stretchable body.

9. The stretchable electronic assembly of claim 1, wherein:
    the at least one meandering conductor connected to at least one electronic component of the plurality of electronic components comprises an electrical trace.

10. The stretchable electronic assembly of claim 9, wherein:
    the at least one meandering conductor connected to at least one electronic component of the plurality of electronic components further comprises an electrical insulator which overlies the electrical trace.

11. The stretchable electronic assembly of claim 10, wherein:
    the electrical insulator is a dielectric insulator.

12. The stretchable electronic assembly of claim 1, wherein:
    the stretchable body is formed of a thermoplastic or thermoset polymer.

13. The stretchable electronic assembly of claim 1, wherein:
    the stretchable body is formed of an elastomer.

14. The stretchable electronic assembly of claim 1, wherein:
    the stretchable body comprises at least one molded body.

15. The stretchable electronic assembly of claim 1, wherein:
    the stretchable body comprises a film.

16. The stretchable electronic assembly of claim 1, wherein:
    the at least one meandering conductor provides an antenna.

* * * * *